United States Patent
Chen

(10) Patent No.: US 7,154,765 B1
(45) Date of Patent: Dec. 26, 2006

(54) FLAT-CELL READ-ONLY MEMORY

(75) Inventor: Hsu-Shun Chen, Toufen Township, Miaoli County (TW)

(73) Assignee: Elan Microelectronics Corporation, Hsinchu (TW)

( * ) Notice: Subject to any disclaimer, the term of this patent is extended or adjusted under 35 U.S.C. 154(b) by 6 days.

(21) Appl. No.: 11/179,570

(22) Filed: Jul. 13, 2005

(30) Foreign Application Priority Data

Jul. 16, 2004 (TW) .............................. 93121419 A

(51) Int. Cl.
*G11C 17/00* (2006.01)

(52) U.S. Cl. ........................................ 365/94; 365/104

(58) Field of Classification Search .................. 365/94, 365/104

See application file for complete search history.

(56) References Cited

U.S. PATENT DOCUMENTS

| | | | | |
|---|---|---|---|---|
| 5,943,286 A | * | 8/1999 | Orita | 365/230.03 |
| 5,966,327 A | * | 10/1999 | Jo | 365/185.11 |
| 6,388,932 B1 | * | 5/2002 | Kohno | 365/210 |

* cited by examiner

*Primary Examiner*—Hoai V. Ho
(74) *Attorney, Agent, or Firm*—Rosenberg, Klein & Lee

(57) ABSTRACT

In a flat-cell ROM including a plurality of memory banks, each of the memory banks comprises a memory array, a plurality of bit lines, a plurality of virtual ground lines, three select lines, and a common row of contacts shared with an adjacent memory bank. The common row of contacts are used for connecting the bit lines and virtual ground lines to bit signal lines and virtual ground lines, respectively, and the select lines are used for selecting memory cells in the memory array. With a common row of contacts shared by two adjacent banks, the ROM area is reduced.

1 Claim, 6 Drawing Sheets

FLAT-CELL READ-ONLY MEMORY

FIELD OF THE INVENTION

The present invention is related generally to a read-only memory (ROM) and more particularly to a flat-cell ROM.

BACKGROUND OF THE INVENTION

Recently, ROM has almost become requisite part in electronic products. FIG. 1 shows a circuit diagram of a conventional flat-cell ROM 100 and for simplification, only a memory bank of the ROM 100 is shown in FIG. 1. In the ROM 100, each memory bank comprises a memory array 102, a plurality of bit lines BL and virtual ground lines VG capable of being connected to the memory array 102, and select lines SL0 and SL1 to select the bit lines BL and virtual ground lines VG to be connected to the memory array 102, and the memory array 102 includes a plurality of transistors 104 serving as the memory cells, with the gates of the transistors 104 on a same row connected to one of word lines WL0~WLN, such that data in each of the memory cells 104 may be read out by selecting the bit lines BL, virtual ground lines VG, and word lines WL0~WLN. FIG. 2 shows a layout of the memory circuit shown in FIG. 1, with two memory banks Bank1 and Bank2 of the ROM 100 for illustration. In each of the memory banks Bank1 and Bank2, either a bit line BL or a virtual ground line VG is connected to a corresponding bit signal line 108 or a virtual ground line 110 through a respective contact 106.

To increase the memory density, there have been proposed various approaches to reduce the ROM area, for example in the flat-cell ROM disclosed in U.S. Pat. No. 5,117,389 to Yiu, less block select transistors is proposed to increase the memory density. As shown in FIG. 2, each memory bank of a conventional flat-cell ROM 100 is provided with two rows of the contacts 106 at the upper and lower sides of the memory bank, and each row of the contacts 106 occupies a chip area. Therefore, the flat-cell ROM 100 may have smaller ROM area, if the number of rows of the contacts 106 is reduced.

SUMMARY OF THE INVENTION

One object of the present invention is to provide a smaller area flat-cell ROM.

Another object of the present invention is to provide a flat-cell ROM using a common row of contacts shared by two memory banks.

In a flat-cell ROM including a plurality of memory banks, according to the present invention, each of the memory banks comprises a memory array, a plurality of bit lines, a plurality of virtual ground lines, three select lines, and a common row of contacts shared with an adjacent memory bank. In the flat-cell ROM, each of the bit lines is capable of being connected to the memory array through a first and a second switches, each of the virtual ground lines is capable of being connected to the memory array through a third and a fourth switches, the common row of contacts are used for connecting the bit lines and virtual ground lines to bit signal lines and virtual ground lines, respectively, and the select lines are used for selecting a memory bank, switching the first and second switches, and switching the third and fourth switches, respectively. In a flat-cell ROM according to the present invention, two adjacent memory banks share a common row of contacts, and thus the number of rows of contacts is reduced, thereby decreasing the ROM area.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 3:
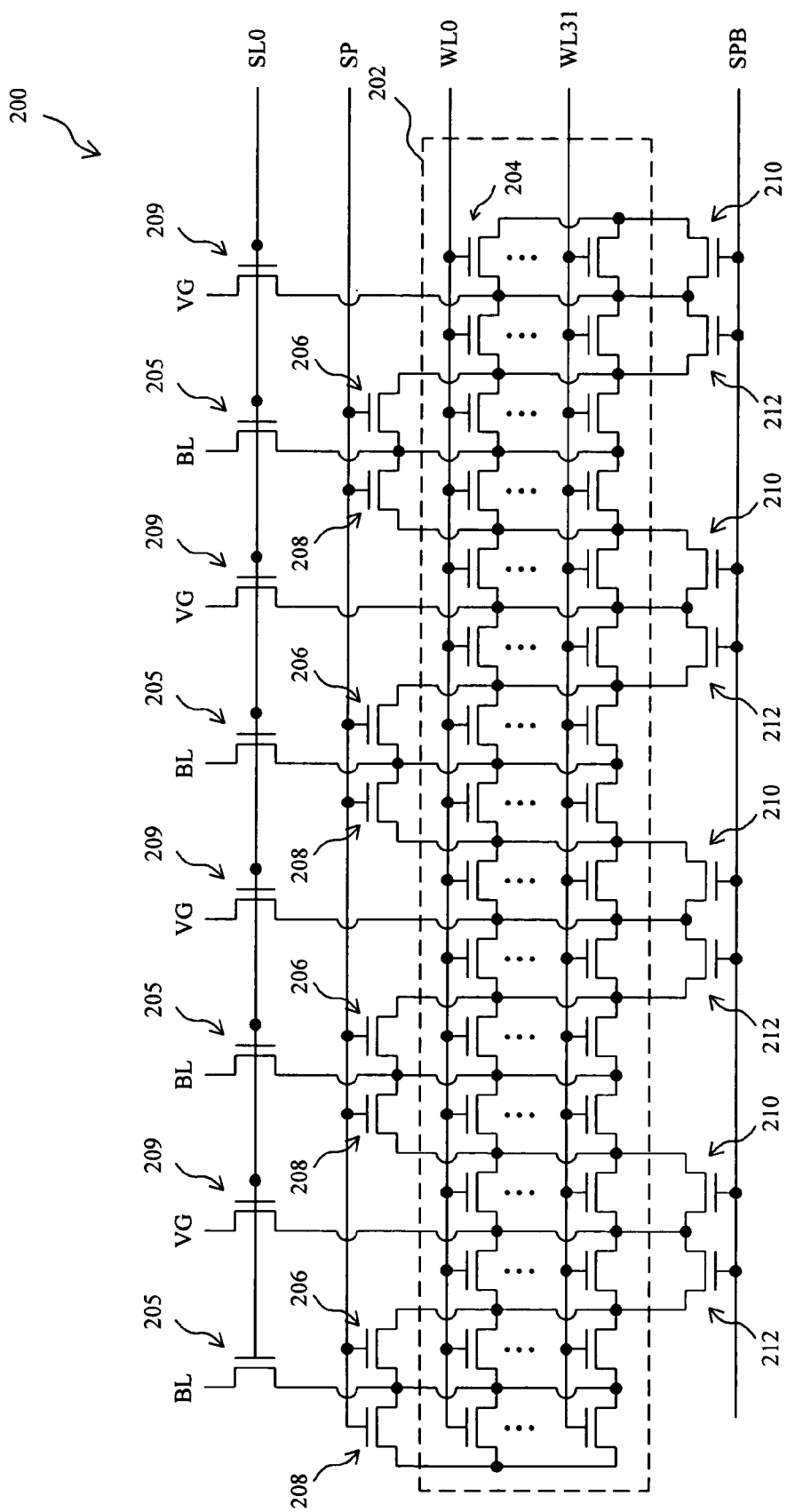
FIG. 3 shows a circuit diagram of a flat-cell ROM according to the present invention.

FIG. 3 shows a circuit diagram of a flat-cell ROM 200 according to the present invention, and for simplification, only a memory bank of the ROM 200 is shown in FIG. 3. In a memory bank of the ROM 200, a plurality of bit lines BL and virtual ground lines VG are capable of being connected to a memory array 202 in such a way that, each of the bit lines BL is provided with transistors 205, and 206 or 208 serving as switches to connect to memory array 202, and each of the virtual ground lines VG is provided with transistors 209, and 210 or 212 serving as switches to connect to memory array 202. The memory array 202 includes a plurality of transistors 204 serving as memory cells arranged in such a way that the transistors 204 on a same row are selected by one of a plurality of word lines WL0~WL31. In the ROM 200, each memory bank includes three select lines SL0, SP, and SPB, in which the select line SL0 switches the transistors 205 and 209 for selecting the memory bank, the select line SP switches the transistors 206 and 208, and the select line SPB switches the transistors 210 and 212. These select lines SL0, SP, and SPB together with the word lines WL0-WLN determine which one of the transistors 204 is selected to be read. In addition, the flat-cell ROM disclosed in U.S. Pat. No. 5,117,389 to Yiu has its select line fix code implemented by a manner of one dead and one left, while the flat-cell ROM 200 of the present invention has the select line fix code implemented by a manner of two dead and two left.

Figure 1:
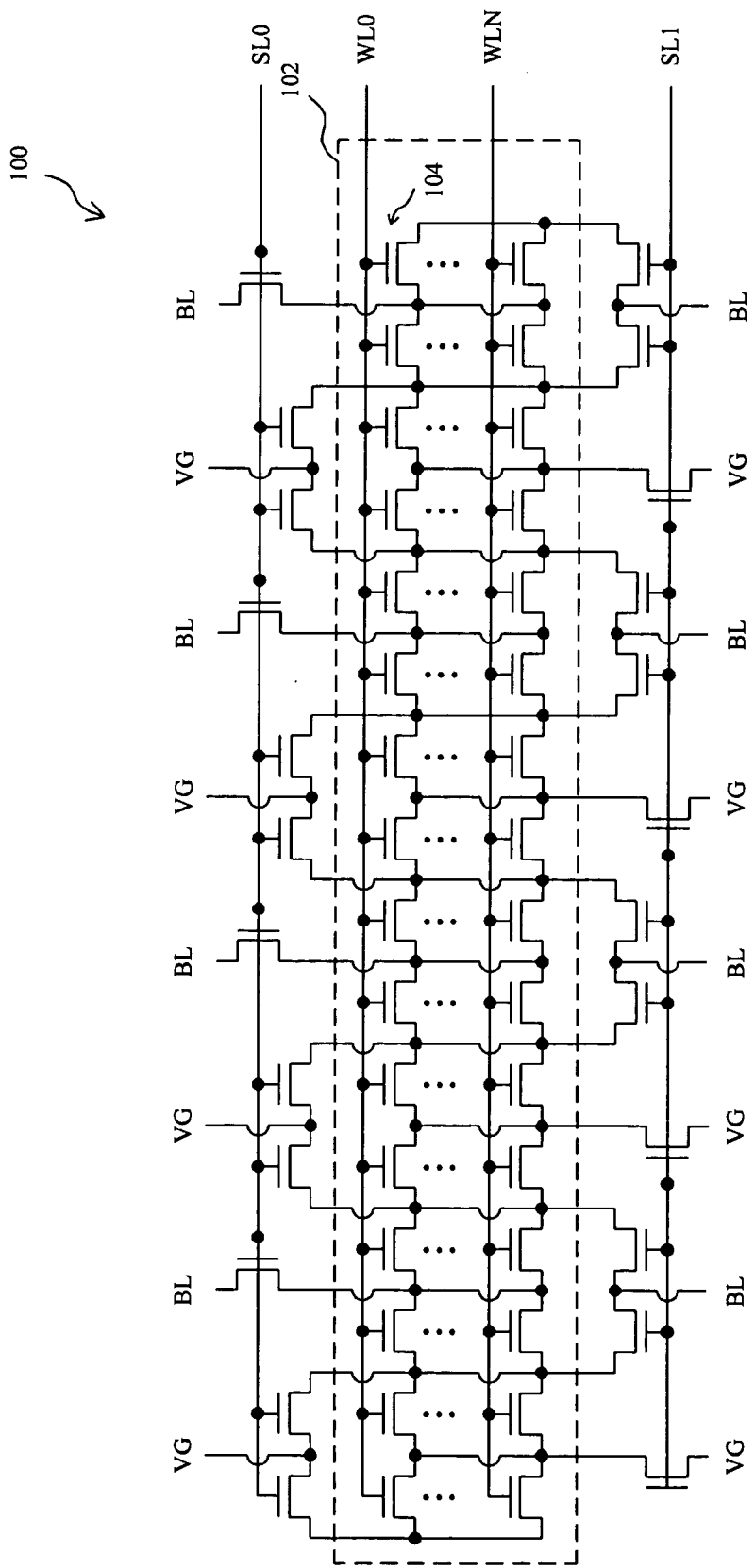
FIG. 1 shows a circuit diagram of a conventional flat-cell ROM.
Figure 2:
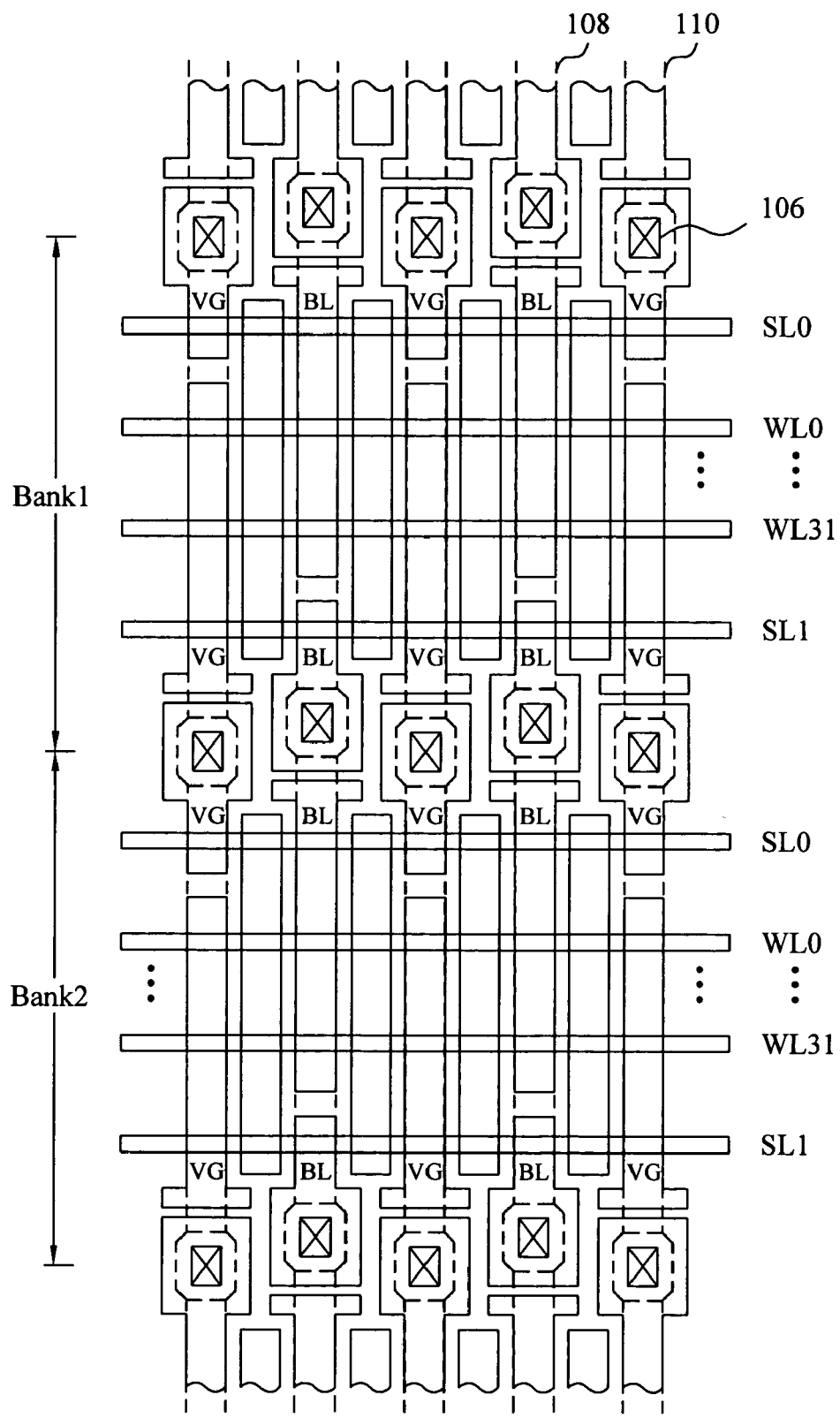
FIG. 2 shows a layout of the memory circuit shown in FIG. 1.
Figure 4:
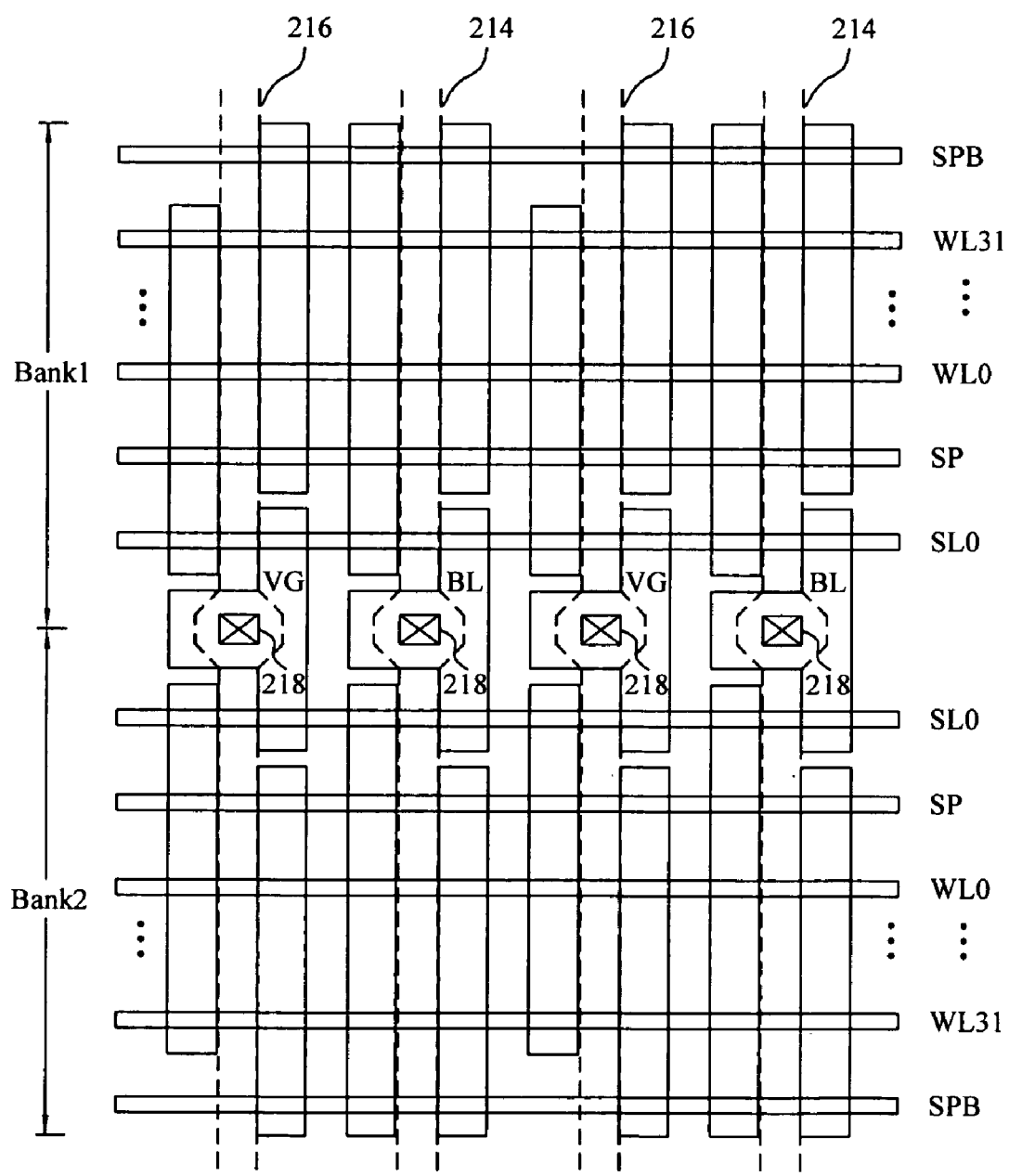
FIG. 4 shows a layout of the memory circuit shown in FIG. 3.

FIG. 4 shows a layout of the memory circuit shown in FIG. 3, with two memory banks Bank1 and Bank2 of the ROM 200 for illustration. In the ROM 200, either the bit line BL or the virtual ground line VG is connected to a corresponding bit signal line 214 or a virtual ground line 216 through a respective contact 218, while the adjacent memory banks Bank1 and Bank2 share a common row of the contacts 218 therebetween. By comparing FIG. 4 with FIG. 2, it is shown that only one row of the contacts 218 are used for the memory banks Bank1 and Bank2 in the ROM 200 of the present invention, while three rows of the contacts 106 are used for the memory banks Bank1 and Bank2 in the conventional ROM 100. Owing to the less number of rows of contacts in the ROM 200, the ROM area is reduced.

Figure 5:
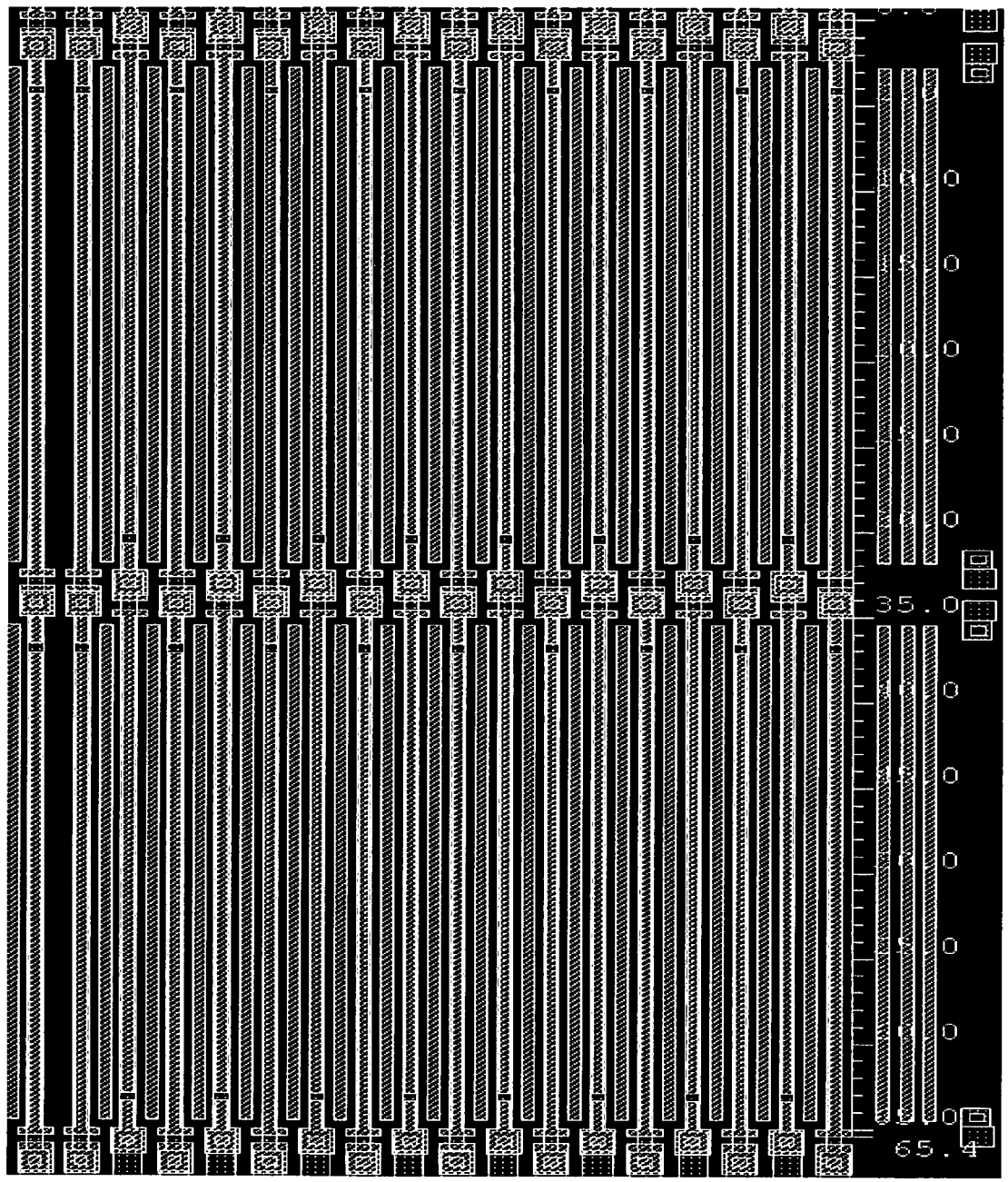
FIG. 5 shows a practical layout of the memory shown in FIG. 1.
Figure 6:
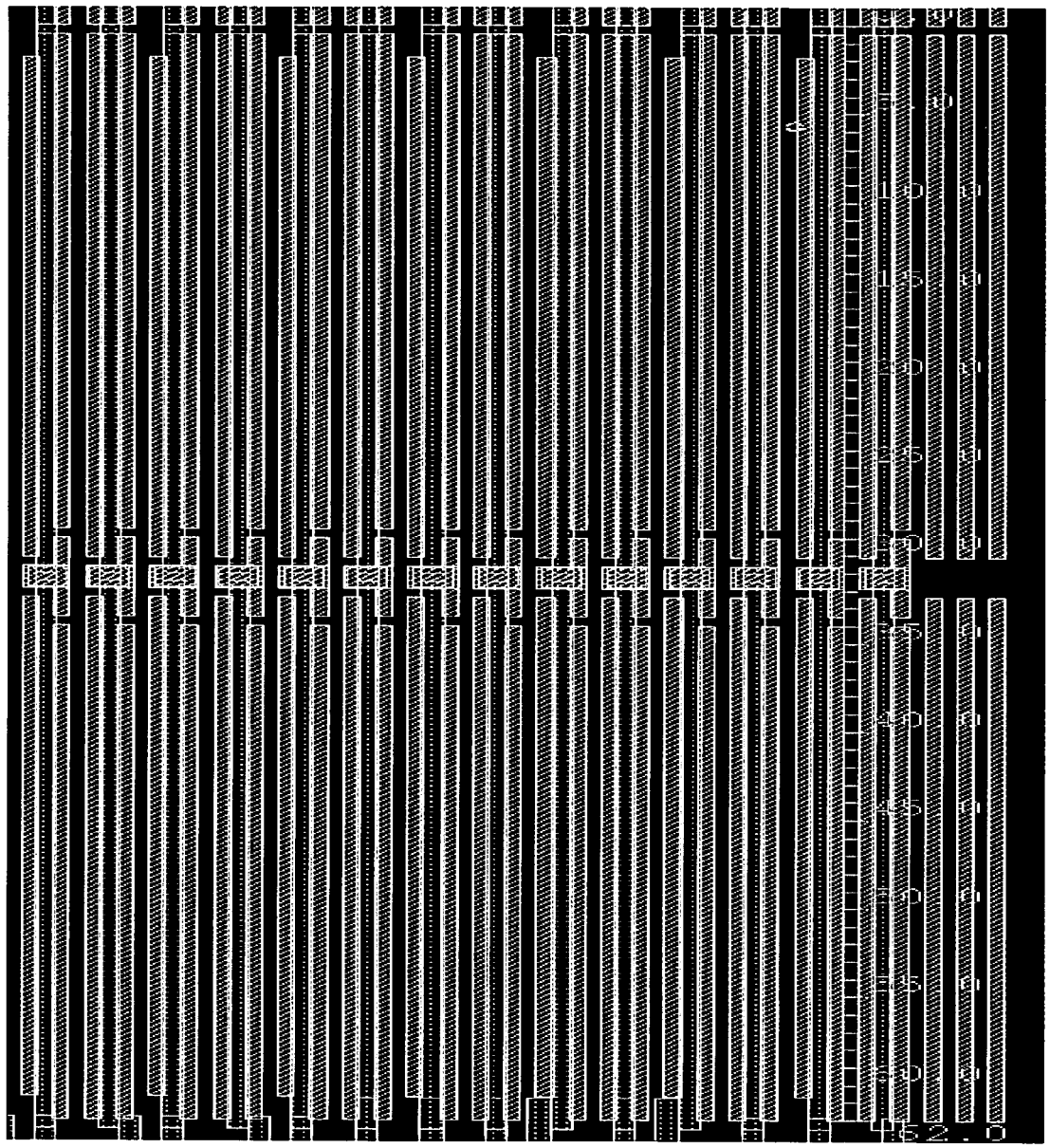
FIG. 6 shows a practical layout of the memory shown in FIG. 3.

For comparison, FIG. 5 shows a practical layout of the conventional ROM 100, and FIG. 6 shows a practical layout of the ROM 200 according to the present invention. As indicated by the scales at the right side of the layouts of FIGS. 5 and 6, respectively, the overall length of two memory banks in the conventional flat-cell ROM 100 is measured as 65.4 μm, while that in the flat-cell ROM 200 of the present invention is measured as 62.0 μm. Then, the area of the flat-cell ROM 200 of the present invention is reduced by approximately 5.2%.

By sharing a common row of contacts by two adjacent memory banks in a flat-cell ROM, the ROM area is reduced.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set fourth in the appended claims.

What is claimed is:

1. In a flat-cell read-only memory including a plurality of memory banks, each of the memory banks comprising:

a memory array;

a plurality of bit lines each capable of being connected to the memory array through a first switch and a second switch;

a plurality of virtual ground lines each capable of being connected to the memory array through a third switch and a fourth switch;

a first select line for selecting one memory bank from the plurality of memory banks;

a second select line for switching the first and second switches; and a third select line for switching the third and fourth switches;

wherein each two adjacent ones of the memory banks share a common row of contacts for connecting the plurality of bit lines and virtual ground lines to a plurality of bit signal lines and virtual ground signal lines, respectively.

* * * * *